United States Patent
Nakano et al.

(10) Patent No.: US 7,264,340 B2
(45) Date of Patent: Sep. 4, 2007

(54) PIEZOELECTRIC ACTUATOR AND INK-JET HEAD, AND INK-JET RECORDER

(75) Inventors: Takanori Nakano, Osaka (JP); Shogo Matsubara, Fukuoka (JP); Shintaro Hara, Fukuoka (JP); Kazuo Nishimura, Osaka (JP); Masaichiro Tatekawa, Osaka (JP); Masakazu Tanahashi, Osaka (JP); Hiroyuki Matsuo, Osaka (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 393 days.

(21) Appl. No.: 10/497,348

(22) PCT Filed: Jan. 14, 2003

(86) PCT No.: PCT/JP03/00187

§ 371 (c)(1), (2), (4) Date: Jun. 1, 2004

(87) PCT Pub. No.: WO03/061024

PCT Pub. Date: Jul. 24, 2003

(65) Prior Publication Data

US 2005/0078154 A1 Apr. 14, 2005

(30) Foreign Application Priority Data

Jan. 15, 2002 (JP) ............................ 2002-005830

(51) Int. Cl.
*B41J 2/045* (2006.01)

(52) U.S. Cl. ...................................................... 347/72
(58) Field of Classification Search ............ 347/68–72; 310/331, 358
See application file for complete search history.

(56) References Cited

U.S. PATENT DOCUMENTS 6,142,615 A * 11/2000 Qiu et al. ..................... 347/70

FOREIGN PATENT DOCUMENTS

| JP | 11-112048 A | 4/1999 |
| JP | 2000-351212 A | 12/2000 |
| JP | 2001-210888 A | 8/2001 |

OTHER PUBLICATIONS

International Search Report for PCT/JP03/00187 mailed Apr. 22, 2003; ISA/JPO.

* cited by examiner

*Primary Examiner*—Stephen Meier
*Assistant Examiner*—Geoffrey S. Mruk
(74) *Attorney, Agent, or Firm*—Harness, Dickey & Pierce, P.L.C.

(57) ABSTRACT

A piezoelectric actuator is constructed by forming a common electrode 27 of Cr, a piezoelectric layer 29 of Pb(Zr, Ti)O$_3$, a cover layer 31 of BaTiO$_3$, and an individual electrode 33 of Pt in this order into a laminate. The thickness of the piezoelectric layer 29 in the lamination direction (T1) and the thickness of the cover layer 31 in the lamination direction (T2) satisfy the relationship of $0.08 \leq T2/T1 \leq 1$. The relative dielectric constant of the piezoelectric layer 29 ($\epsilon$r1) and the relative dielectric constant of the cover layer 31 ($\epsilon$r2) satisfy the relationship of $\epsilon r2/\epsilon r1 \geq 0.2$.

22 Claims, 6 Drawing Sheets

| T2/T1 (Layer thickness ratio) | Incidence of dielectric breakdown (%) |
|---|---|
| 0 | 33 |
| 0.05 | 5 |
| 0.08 | 0 |
| 0.11 | 0 |
| 0.43 | 0 |
| 1.0 | 0 |

PIEZOELECTRIC ACTUATOR AND INK-JET HEAD, AND INK-JET RECORDER

TECHNICAL FIELD

The present invention relates to a piezoelectric actuator and an inkjet head including the same, and to an inkjet recording apparatus.

BACKGROUND ART

Conventionally, an inkjet head which uses the piezoelectric effect of a piezoelectric element for recording has been known.

This inkjet head has a piezoelectric actuator. The piezoelectric actuator includes a common electrode, a piezoelectric element and an individual electrode, which are formed in this order into a layered structure. A diaphragm is formed over a surface of the piezoelectric actuator. The diaphragm is adhered onto an ink passage member with an adhesive to form a pressure chamber. In order to eject ink, the voltage is applied to the common electrode and the individual electrode, so that the piezoelectric element expands or shrinks. The expansion/shrinkage is constrained by the diaphragm, whereby the piezoelectric actuator deflects in the thickness direction. The deflection causes a change in the volume of the pressure chamber, so that the ink in the pressure chamber is ejected from a nozzle.

However, in a production process of the piezoelectric actuator, at the step of forming a piezoelectric element on an electrode, foreign substance adhered when the electrode is formed by sputtering is, for example, introduced into the piezoelectric element, whereby a defective portion is generated in the piezoelectric element in some cases. Due to the defective portion, the voltage-withstanding characteristics of the piezoelectric element deteriorate, so that there is a possibility that dielectric breakdown is caused in an ink ejection operation.

In a technique disclosed in Japanese Unexamined Patent Publication No. 2000-351212, an insulating material is applied onto a piezoelectric element using a spin coater such that a defective portion is filled with the insulating material, and an insulating layer is formed on the piezoelectric element. Then, the insulating layer is removed by dry etching in order to prevent the deterioration of the piezoelectric characteristics. As a result, the voltage-withstanding characteristics of the piezoelectric element are improved, and dielectric breakdown is prevented.

However, removing only the insulating layer by dry etching is not an easy task. Furthermore, because of the difficult task of removing the insulating layer, the production yield is decreased, and the production cost is increased.

The present invention was conceived in view of the above problems. An objective of the present invention is to improve the piezoelectric characteristics and voltage-withstanding characteristics of a piezoelectric element without removing an insulating layer formed on the piezoelectric element.

DISCLOSURE OF INVENTION

The first invention is a piezoelectric actuator comprising: a first electrode layer; a piezoelectric layer formed of a piezoelectric material on the first electrode layer; a cover layer formed of an insulating material on the piezoelectric layer; and a second electrode layer formed on the cover layer, which functions together with the first electrode layer to apply a voltage to the piezoelectric layer, wherein the thickness of the piezoelectric layer in the lamination direction, T1, and the thickness of the cover layer in the lamination direction, T2, satisfy the relationship of $0 < T2/T1 \leq 1$.

The capacitance between the first electrode layer and the second electrode layer is inversely proportional to the interval between these electrode layers. Thus, when the cover layer is thick, the piezoelectric characteristics of the piezoelectric layer deteriorate.

However, in a piezoelectric actuator of the present invention, the deterioration of the piezoelectric characteristics of the piezoelectric layer is prevented because the thickness of the piezoelectric layer in the lamination direction, T1, and the thickness of the cover layer in the lamination direction, T2, satisfy the relationship of $0 < T2/T1 \leq 1$.

The second invention is a piezoelectric actuator comprising: a first electrode layer; a piezoelectric layer formed of a piezoelectric material on the first electrode layer; a cover layer formed of an insulating material on the piezoelectric layer; and a second electrode layer formed on the cover layer, which functions together with the first electrode layer to apply a voltage to the piezoelectric layer, wherein the thickness of the piezoelectric layer in the lamination direction, T1, and the thickness of the cover layer in the lamination direction, T2, satisfy the relationship of $T2/T1 \geq 0.08$.

In the case where the cover layer is thin, the effect of improving the voltage-withstanding characteristics of the piezoelectric layer deteriorates.

However, in a piezoelectric actuator of the present invention, the voltage-withstanding characteristics of the piezoelectric layer are improved because the thickness of the piezoelectric layer in the lamination direction, T1, and the thickness of the cover layer in the lamination direction, T2, satisfy the relationship of $T2/T1 \geq 0.08$.

The third invention is a piezoelectric actuator comprising: a first electrode layer; a piezoelectric layer formed of a piezoelectric material on the first electrode layer; a cover layer formed of an insulating material on the piezoelectric layer; and a second electrode layer formed on the cover layer, which functions together with the first electrode layer to apply a voltage to the piezoelectric layer, wherein the relative dielectric constant of the piezoelectric layer, $\epsilon r1$, and the relative dielectric constant of the cover layer, $\epsilon r2$, satisfy the relationship of $\epsilon r2/\epsilon r1 \geq 0.2$.

The capacitance between the first electrode layer and the second electrode layer is proportional to the dielectric constant of a dielectric provided between these electrode layers. Thus, when the dielectric constant of the cover layer is low, the piezoelectric characteristics of the piezoelectric layer are low.

However, in a piezoelectric actuator of the present invention, the deterioration of the piezoelectric characteristics of the piezoelectric layer is prevented because the relative dielectric constant of the piezoelectric layer, $\epsilon r1$, and the relative dielectric constant of the cover layer, $\epsilon r2$, satisfy the relationship of $\epsilon r2/\epsilon r1 \geq 0.2$.

The fourth invention is based on the first invention, wherein the thickness of the piezoelectric layer in the lamination direction, T1, and the thickness of the cover layer in the lamination direction, T2, satisfy the relationship of $T2/T1 \geq 0.08$.

With the above structure, the deterioration of the piezoelectric characteristics of the piezoelectric layer is prevented, and the voltage-withstanding characteristics of the piezoelectric layer are improved, because the relationship of $0.08 \leq T2/T1 \leq 1$ is satisfied.

The fifth invention is based on the first invention, wherein the relative dielectric constant of the piezoelectric layer, $\in r1$, and the relative dielectric constant of the cover layer, $\in r2$, satisfy the relationship of $\in r2/\in r1 \geq 0.2$.

With the above structure, the deterioration of the piezoelectric characteristics of the piezoelectric layer is prevented because both the relationship of $0 < T2/T1 \leq 1$ and the relationship of $\in r2/\in r1 \geq 0.2$ are satisfied.

The sixth invention is based on the second invention, wherein the relative dielectric constant of the piezoelectric layer, $\in r1$, and the relative dielectric constant of the cover layer, $\in r2$, satisfy the relationship of $\in r2/\in r1 \geq 0.2$.

With the above structure, the deterioration of the piezoelectric characteristics of the piezoelectric layer is prevented, and the voltage-withstanding characteristics of the piezoelectric layer are improved, because both the relationship of $T2/T1 \geq 0.08$ and the relationship of $\in r2/\in r1 \geq 0.2$ are satisfied.

The seventh invention is based on the second invention, wherein the thickness of the piezoelectric layer in the lamination direction, T1, and the thickness of the cover layer in the lamination direction, T2, satisfy the relationship of $T2/T1 \leq 1$; and the relative dielectric constant of the piezoelectric layer, $\in r1$, and the relative dielectric constant of the cover layer, $\in r2$, satisfy the relationship of $\in r2/\in r1 \geq 0.2$.

With the above structure, the deterioration of the piezoelectric characteristics of the piezoelectric layer is prevented, and the voltage-withstanding characteristics of the piezoelectric layer are improved, because both the relationship of $0.08 \leq T2/T1 \leq 1$ and the relationship of $\in r2/\in 1 \geq 0.2$ are satisfied.

The eighth invention is based on the first invention, wherein the piezoelectric layer and the cover layer include at least one same chemical element.

With the above structure, the adhesion between the piezoelectric layer and the cover layer is improved because the piezoelectric layer and the cover layer have the same chemical element. Thus, separation of the piezoelectric layer and the cover layer and generation of a crack, which are caused by repetitious application of external force, are prevented.

The ninth invention is based on the second invention, wherein the piezoelectric layer and the cover layer include at least one same chemical element.

With the above structure, the adhesion between the piezoelectric layer and the cover layer is improved because the piezoelectric layer and the cover layer have the same chemical element. Thus, separation of the piezoelectric layer and the cover layer and generation of a crack, which are caused by repetitious application of external force, are prevented.

The tenth invention is based on the third invention, wherein the piezoelectric layer and the cover layer include at least one same chemical element.

With the above structure, the adhesion between the piezoelectric layer and the cover layer is improved because the piezoelectric layer and the cover layer have the same chemical element. Thus, separation of the piezoelectric layer and the cover layer and generation of a crack, which are caused by repetitious application of external force, are prevented.

The eleventh invention is based on the first invention, wherein the cover layer is formed of a piezoelectric material.

With the above structure, the cover layer also exhibits a piezoelectric effect when a voltage is applied between the first electrode layer and the second electrode layer because the cover layer is formed of a piezoelectric material. Thus, the deterioration of the piezoelectric characteristics which may be caused by provision of the cover layer is further suppressed.

The twelfth invention is based on the second invention, wherein the cover layer is formed of a piezoelectric material.

With the above structure, the cover layer also exhibits a piezoelectric effect when a voltage is applied between the first electrode layer and the second electrode layer because the cover layer is formed of a piezoelectric material. Thus, the deterioration of the piezoelectric characteristics which may be caused by provision of the cover layer is further suppressed.

The thirteenth invention is based on the third invention, wherein the cover layer is formed of a piezoelectric material.

With the above structure, the cover layer also exhibits a piezoelectric effect when a voltage is applied between the first electrode layer and the second electrode layer because the cover layer is formed of a piezoelectric material. Thus, the deterioration of the piezoelectric characteristics which may be caused by provision of the cover layer is further suppressed.

The fourteenth invention is based on the first invention, wherein part of the cover layer fills a defective portion formed in the piezoelectric layer or a defective portion continuously formed in the first electrode layer and the piezoelectric layer.

With the above structure, the adhesion between the piezoelectric layer and the cover layer is improved because the defective portion is filled with part of the cover layer. Thus, separation of the piezoelectric layer and the cover layer and generation of a crack, which may be caused by repetitious application of external force, are further prevented.

The fifteenth invention is based on the second invention, wherein part of the cover layer fills a defective portion formed in the piezoelectric layer or a defective portion continuously formed in the first electrode layer and the piezoelectric layer.

With the above structure, the adhesion between the piezoelectric layer and the cover layer is improved because the defective portion is filled with part of the cover layer. Thus, separation of the piezoelectric layer and the cover layer and generation of a crack, which may be caused by repetitious application of external force, are further prevented.

The sixteenth invention is based on the third invention, wherein part of the cover layer fills a defective portion formed in the piezoelectric layer or a defective portion continuously formed in the first electrode layer and the piezoelectric layer.

With the above structure, the adhesion between the piezoelectric layer and the cover layer is improved because the defective portion is filled with part of the cover layer. Thus, separation of the piezoelectric layer and the cover layer and generation of a crack, which may be caused by repetitious application of external force, are further prevented.

The seventeenth invention is an inkjet head comprising the piezoelectric actuator of the first invention.

With the above structure, the deterioration of the piezoelectric characteristics of the piezoelectric layer is prevented, and the voltage-withstanding characteristics of the piezoelectric layer are improved. As a result, a long-life inkjet head wherein the deterioration of the recording quality is prevented is obtained.

The eighteenth invention is an inkjet head comprising the piezoelectric actuator of the second invention.

With the above structure, the deterioration of the piezoelectric characteristics of the piezoelectric layer is prevented, and the voltage-withstanding characteristics of the piezoelectric layer are improved. As a result, a long-life inkjet head wherein the deterioration of the recording quality is prevented is obtained.

The nineteenth invention is an inkjet head comprising the piezoelectric actuator of the third invention.

With the above structure, the deterioration of the piezoelectric characteristics of the piezoelectric layer is prevented, and the voltage-withstanding characteristics of the piezoelectric layer are improved. As a result, a long-life inkjet head wherein the deterioration of the recording quality is prevented is obtained.

The twentieth invention is an inkjet recording apparatus comprising: the inkjet head of the seventeenth invention; and transfer means for relatively transferring the inkjet head and a recording medium.

With the above structure, the deterioration of the piezoelectric characteristics of the piezoelectric layer is prevented, and the voltage-withstanding characteristics of the piezoelectric layer are improved. As a result, a high-quality inkjet recording apparatus is obtained.

The twenty-first invention is an inkjet recording apparatus comprising: the inkjet head of the eighteenth invention; and transfer means for relatively transferring the inkjet head and a recording medium.

With the above structure, the deterioration of the piezoelectric characteristics of the piezoelectric layer is prevented, and the voltage-withstanding characteristics of the piezoelectric layer are improved. As a result, a high-quality inkjet recording apparatus is obtained.

The twenty-second invention is an inkjet recording apparatus comprising: the inkjet head of the nineteenth invention; and transfer means for relatively transferring the inkjet head and a recording medium.

With the above structure, the deterioration of the piezoelectric characteristics of the piezoelectric layer is prevented, and the voltage-withstanding characteristics of the piezoelectric layer are improved. As a result, a high-quality inkjet recording apparatus is obtained.

BEST FOR CARRYING OUT THE INVENTION

Figure 1:
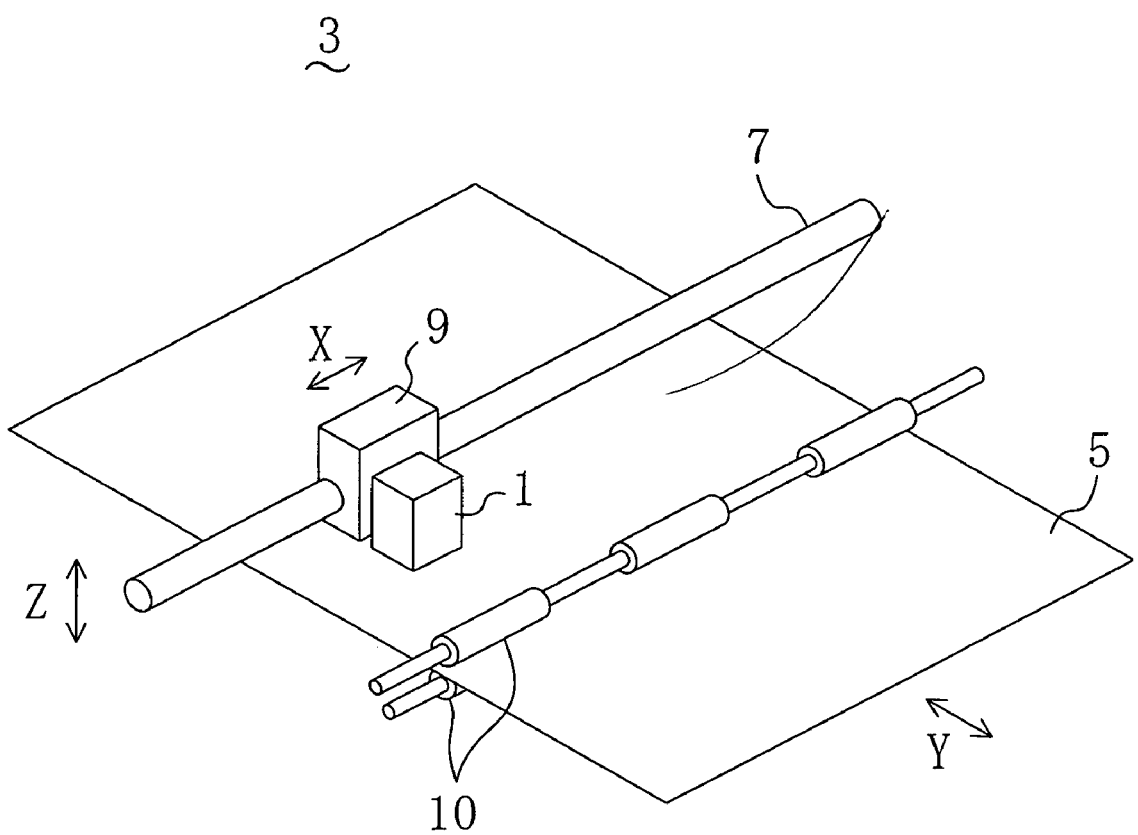
FIG. 1 shows a general structure of an inkjet recording apparatus.

As shown in FIG. 1, an inkjet head 1 according to this embodiment is incorporated in an inkjet printer (inkjet recording apparatus) 3. The inkjet head 1 ejects an ink droplet onto a recording medium 5, such as paper, or the like, for recording.

The inkjet head 1 is mounted on a carriage 9 which reciprocatingly moves along a carriage shaft 7 and reciprocates together with the carriage 9 along major scanning direction X. A roller 10 transfers the recording medium 5 along minor scanning direction Y every time the carriage 9 moves one scanning distance along major scanning direction X.

Figure 2:
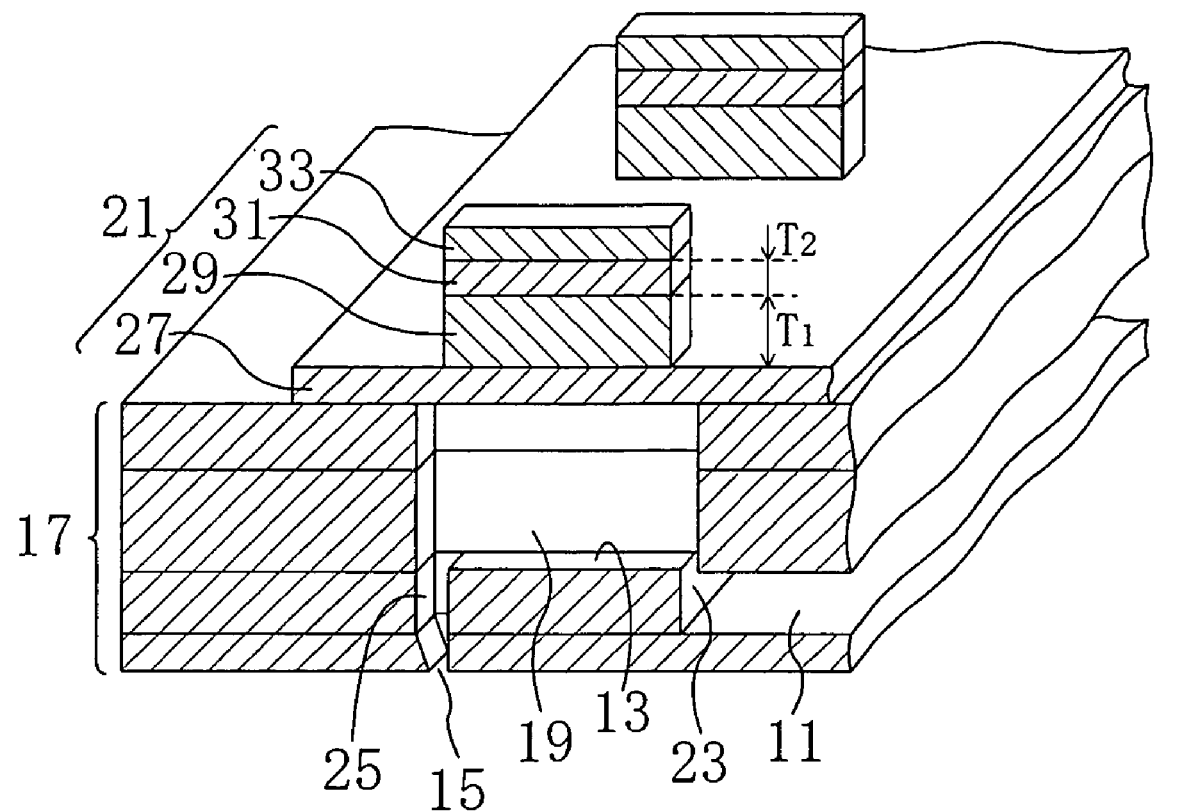
FIG. 2 is a partially-cutaway perspective view showing an inkjet head according to an embodiment.
Figure 2:
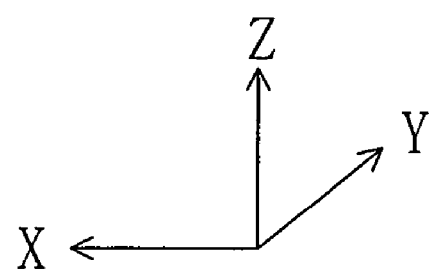

As shown in FIG. 2, the inkjet head 1 includes a head main body 17 and a piezoelectric actuator 21. The head main body 17 includes a common ink chamber 11, a plurality of pressure chamber cavities 13 and a plurality of nozzles 15. The piezoelectric actuator 21 puts pressure on ink contained in a pressure chamber 19.

The pressure chamber cavities 13 of the head main body 17 are provided along minor scanning direction Y with predetermined intervals. The pressure chamber cavities 13 are each formed to have a generally-rectangular opening cross section (XY cross section) elongated along major scanning direction X. An ink supply hole 23 which connects the common ink chamber 11 and the pressure chamber 19 is formed at one longitudinal end of the bottom of each pressure chamber cavity 13 (right end in FIG. 2). At the other end (left end in FIG. 2), an ink passage 25 which connects the pressure chamber 19 and the nozzle 15 is formed.

(Piezoelectric Actuator Formation Method 1)

The piezoelectric actuator 21 includes: a common electrode 27 formed of Cr having a thickness of 1 to 10 μm; a piezoelectric layer 29 formed of Pb(Zr,Ti)O$_3$ having a thickness of 3.0 μm on the common electrode 27; a cover layer 31 having a thickness of 1.5 μm on the piezoelectric layer 29; and an individual electrode 33 formed of Pt having a thickness of 0.1 to 0.2 μm on the cover layer 31. The common electrode 27 also functions as a diaphragm. The cover layer 31 is formed of a piezoelectric material, such as BaTiO$_3$, PbTiO$_3$, Pb(Zr,Ti)O$_3$, PbZrO$_3$, SrTiO$_3$, or a composition obtained by adding an additive to any of these materials, or the like. The piezoelectric layer 29, the cover layer 31 and the individual electrode 33 are provided at a position corresponding to each pressure chamber cavity 13 of the head main body 17. It should be noted that the first electrode layer of the present invention corresponds to the common electrode 27, and the second electrode layer corresponds to the individual electrode 33.

Next, a method for forming the inkjet head 1 is described with reference to FIG. 3.

In the first place, as shown in FIG. 3(*a*), a common electrode 27 is formed of Cr over the entire surface of a Si substrate 47.

Then, as shown in FIG. 3(*b*), a piezoelectric layer 29 is formed on the common electrode 27 by sputtering, vapor deposition, or the like. In this step, a defective portion 51 is formed in the piezoelectric layer 29 in some cases. Further, in other cases, defective portions 53 and 55 are continuously formed in the common electrode 27 and the piezoelectric layer 29. These defective portions 51, 53 and 55 are, for example, gaps 55 which are produced as a result of abnormal growth of the piezoelectric layer 29 due to foreign substance 57 adhered on the Si substrate 47, and pin holes 51 and 53 which are produced due to foreign substance adhered on the Si substrate 47 in the process of forming the piezoelectric layer 29 by sputtering.

Figure 3A:
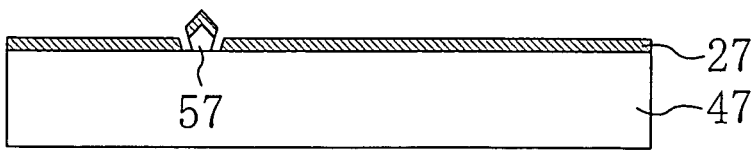
FIG. 3 illustrates a production process of an inkjet head according to an embodiment.
Figure 3B:
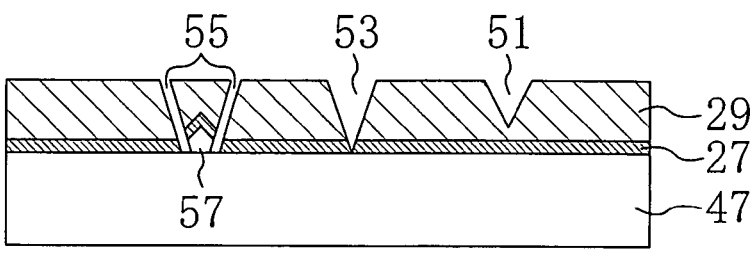
Figure 3C:
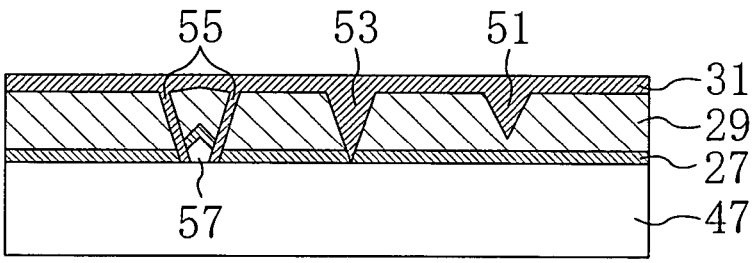

Then, as shown in FIG. 3(c), a cover layer 31 is formed on the piezoelectric layer 29 and in the defective portions 51, 53 and 55 by sputtering, MOCVD, or the like.

In order to surely prevent the gaps 55 from expanding in the cover layer 31, it is only necessary to prevent the cover layer 31 from epitaxially growing with respect to the piezoelectric layer 29. Thus, it is preferable that the cover layer 31 and the piezoelectric layer 29 have different crystal orientations. Further, since the cover layer 31 is injected in the thickness direction of the defective portions 51, 53 and 55 of the piezoelectric layer 29, the adhesion strength of the piezoelectric layer 29 and the cover layer 31 is increased. Furthermore, in consideration of improvement in the adhesion strength of the piezoelectric layer 29 and the cover layer 31, the cover layer 31 and the piezoelectric layer 29 preferably contain the same chemical element.

Figure 3D:
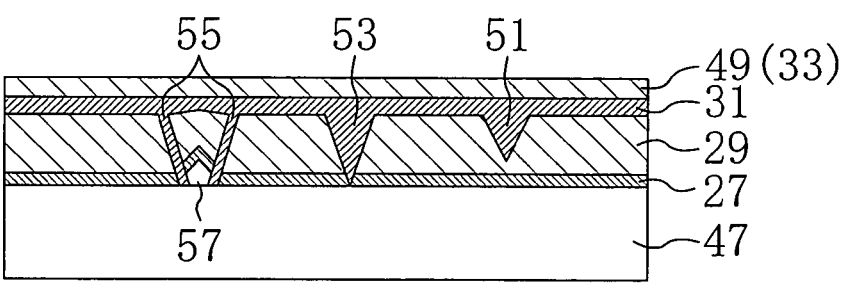

Then, as shown in FIG. 3(d), an upper electrode 49 is formed of Pt on the cover layer 31 by sputtering, vapor deposition, or the like.

Then, the upper electrode 49, the cover layer 31 and the piezoelectric layer 29 are individualized (patterned) to form an individual electrode 33, and the cover layer 31 and piezoelectric layer 29 are removed except for a portion corresponding to the position of the individual electrode 33. The individualization is performed by etching, or the like.

Figure 3E:
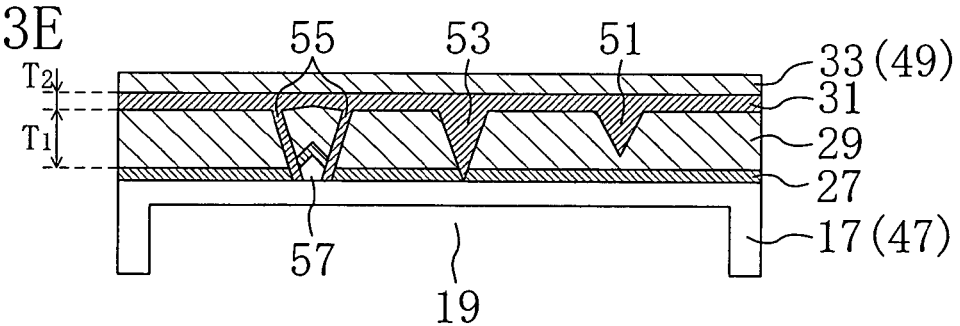
Figure 3F:
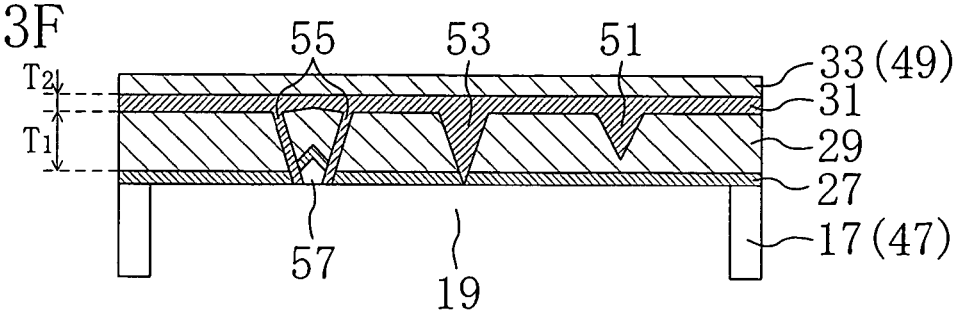

In the last, as shown in FIG. 3(e), the Si substrate 47 is processed to form a pressure chamber 19. Thus, the head main body 17 is completed. At the step of processing the Si substrate 47 to form the pressure chamber 19, part of the Si substrate 47 which corresponds to the position of the individual electrode 33 may be entirely removed as shown in FIG. 3(f). In consideration of convenience at the step of processing the Si substrate 47 to form the pressure chamber 19, for example, specifically, for the purpose of preventing damage to the common electrode 27 or preventing the ink contained in the pressure chamber 19 from flowing from a portion near the defective portions 53 and 55 into the piezoelectric layer 29, a stopper layer (not shown) may be provided between the Si substrate 47 and the common electrode 27.

As described above, in piezoelectric actuator formation method 1, the Si substrate 47 is diverted to the pressure chamber 19. On the other hand, another formation method is possible wherein an individual electrode 33, a piezoelectric layer 29, a cover layer 31, a common electrode 27 and a diaphragm are formed on a substrate, a resultant structure is adhered onto a separately-prepared pressure chamber, and the substrate is removed from the structure, as will be described later as to piezoelectric actuator formation method 2. Hereinafter, piezoelectric actuator formation method 2 is described in detail.

(Piezoelectric Actuator Formation Method 2)

The piezoelectric actuator 21 includes: an individual electrode 33 formed of Pt having a thickness of 0.1 to 0.2 μm; a piezoelectric layer 29 formed of Pb(Zr,Ti)O$_3$ having a thickness of 3.0 μm on the individual electrode 33; a cover layer 31 formed on the piezoelectric layer 29; and a common electrode 27 formed of Cr having a thickness of 1 to 10 μm on the cover layer 31. The common electrode 27 also functions as a diaphragm. The cover layer 31 is formed of a piezoelectric material, such as BaTiO$_3$, PbTiO$_3$, Pb(Zr,Ti)O$_3$, PbZrO$_3$, SrTiO$_3$, or a composition obtained by adding an additive to any of these materials, or the like. The piezoelectric layer 29, the cover layer 31 and the individual electrode 33 are provided at a position corresponding to each pressure chamber cavity 13 of the head main body 17. It should be noted that the first electrode layer of the present invention corresponds to the individual electrode 33, and the second electrode layer corresponds to the common electrode 27.

Next, a method for forming the inkjet head 1 is described with reference to FIG. 4.

Figure 4A:
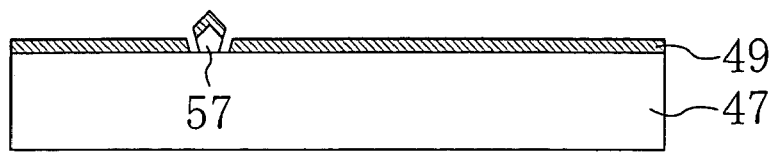
FIG. 4 illustrates a production process of an inkjet head according to an embodiment.

In the first place, as shown in FIG. 4(a), an electrode 49 is formed of Pt over the entire surface of a MgO substrate 47. The electrode 49 is to be processed into the individual electrode 33 at a later step.

Figure 4B:
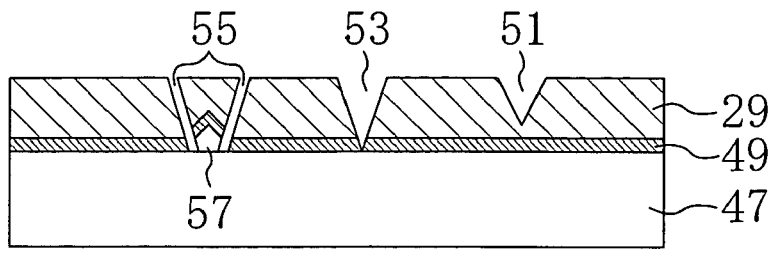

Then, as shown in FIG. 4(b), a piezoelectric layer 29 is formed on the electrode 49 by sputtering, vapor deposition, or the like. In this step, a defective portion 51 is formed in the piezoelectric layer 29 in some cases. Further, in other cases, defective portions 53 and 55 are continuously formed in the electrode 49 and the piezoelectric layer 29. These defective portions 51, 53 and 55 are, for example, gaps 55 which are produced as a result of abnormal growth of the piezoelectric layer 29 due to foreign substance 57 adhered on the MgO substrate 47, and pin holes 51 and 53 which are produced above the MgO substrate 47 in the process of forming the piezoelectric layer 29 by sputtering.

Figure 4C:
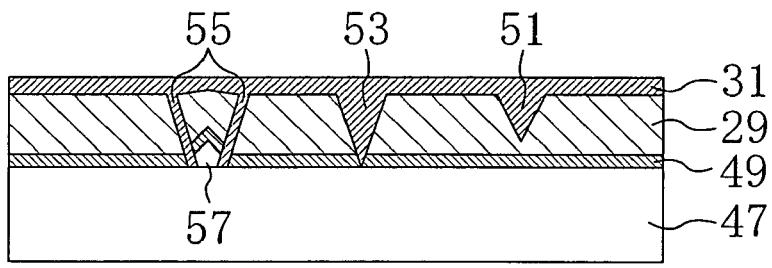

Then, as shown in FIG. 4(c), a cover layer 31 is formed on the piezoelectric layer 29 and in the defective portions 51, 53 and 55 by sputtering, MOCVD, or the like.

In order to surely prevent the gaps 55 from expanding in the cover layer 31, it is only necessary to epitaxially grow the cover layer 31 with respect to the piezoelectric layer 29. Thus, it is preferable that the cover layer 31 and the 5 piezoelectric layer 29 have different crystal orientations. Further, since the cover layer 31 is injected in the thickness direction of the defective portions 51, 53 and 55 of the piezoelectric layer 29, the adhesion strength of the piezoelectric layer 29 and the cover layer 31 is increased. Furthermore, in consideration of improvement in the adhesion strength of the piezoelectric layer 29 and the cover layer 31, the cover layer 31 and the piezoelectric layer 29 preferably contain the same chemical element.

Figure 4D:
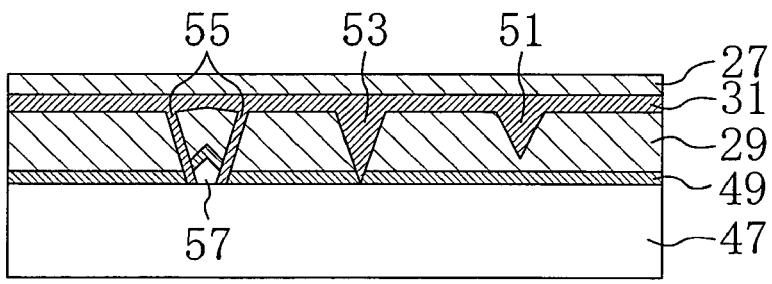

Then, as shown in FIG. 4(d), a common electrode 27 is formed on the cover layer 31 by sputtering, vapor deposition, or the like.

Figure 4E:
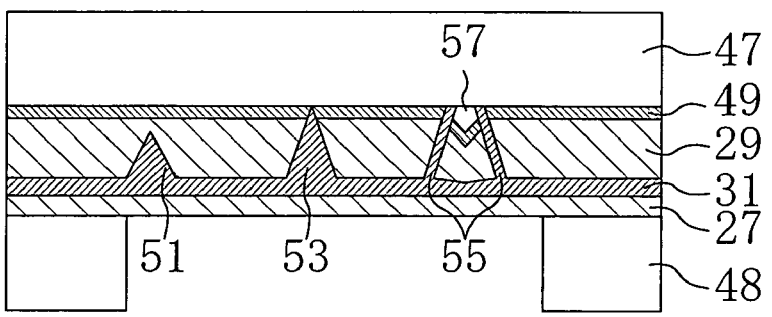

Then, as shown in FIG. 4(e), a substrate 48 having a pressure chamber formed therein is adhered onto the common electrode 27.

Figure 4F:
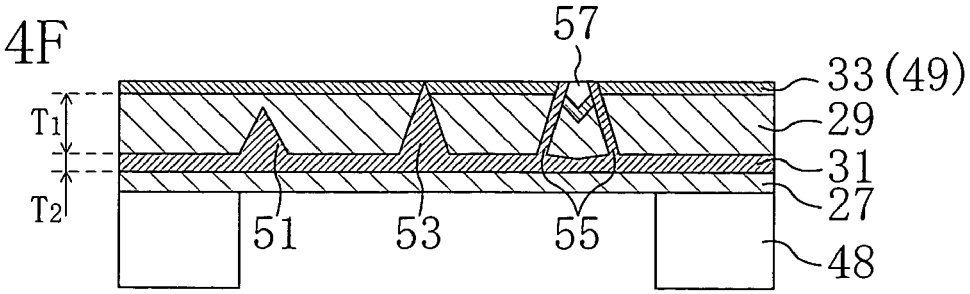

Then, as shown in FIG. 4(f), the MgO substrate 47 is removed by etching, or the like. In the last, the upper electrode 49, the piezoelectric layer 29 and the cover layer 31 are individualized to form an individual electrode 33, and the cover layer 31 and piezoelectric layer 29 are removed except for a portion corresponding to the position of the individual electrode 33. The individualization is performed by etching, or the like.

In the present embodiment, the thickness of the piezoelectric layer 29 in the lamination direction (T1), the thickness of the cover layer 31 in the lamination direction (T2), the relative dielectric constant of the piezoelectric layer 29 (∈r1), and the relative dielectric constant of the cover layer 31 (∈r2) are determined based on examination results described below. It should be noted that thickness T2 of the cover layer 31 in the lamination direction means the thickness between the upper surface of the piezoelectric layer 29 and the upper surface of the cover layer 31 (see FIG. 5).

(Example of Estimation Method for Decrease Rate of Piezoelectric Characteristics and Incidence of Dielectric Breakdown)

Figure 5:
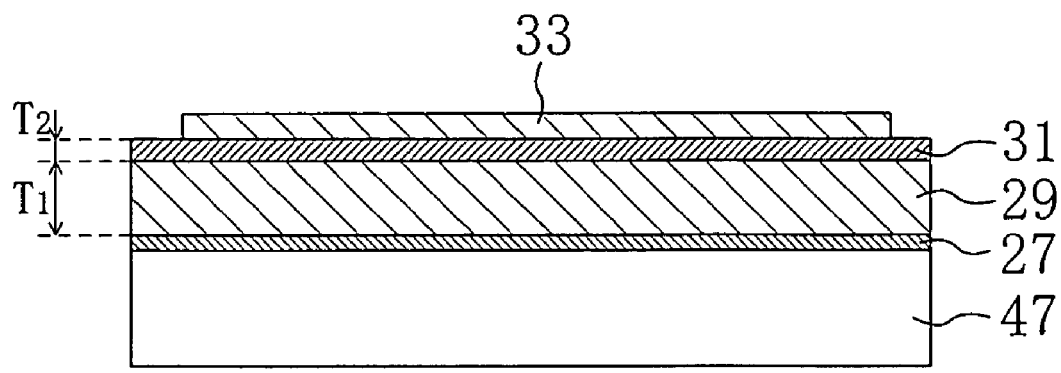
FIG. 5 is a cross-sectional view of a piezoelectric actuator used in measurement of the decrease rate of the piezoelectric characteristics and measurement of the incidence of dielectric breakdown according to an embodiment.

In the present experiment, for the purpose of readily estimating the decrease rate of the piezoelectric characteristics and the incidence of the dielectric breakdown which will be described later, a simplified piezoelectric actuator 21 shown in FIG. 5 was used as a test item, wherein the piezoelectric actuator 21 includes a MgO substrate 47 having a thickness of 0.3 mm, a common electrode 27 having a thickness of 0.1 µm, a piezoelectric layer 29, a cover layer 31, and a plurality of individual electrodes 33 each having a volume of 1 mm×15 mm×0.1 µm (thickness), which are layered in this order.

Herein, a plurality of piezoelectric actuators 21 which have different thickness ratios (T2/T1) of the thickness of the piezoelectric layer 29 in the lamination direction (T1) and the thickness of the cover layer 31 in the lamination direction (T2) were prepared. A voltage was applied between the common electrode 27 and the individual electrode 33 in each of the piezoelectric actuators 21 having different thickness ratios (T2/T1), and the displacement caused by application of the voltage was measured. Then, the decrease rate of the piezoelectric characteristics of each piezoelectric actuator 21 was estimated based on the displacement. Herein, the decrease rate of the piezoelectric characteristics means the ratio of the decrement of displacement of each of the piezoelectric actuators 21 having different thickness ratios (T2/T1) to the normal displacement of a piezoelectric actuator having no cover layer which is caused by voltage application where the normal displacement is assumed as 1.

Figure 6:
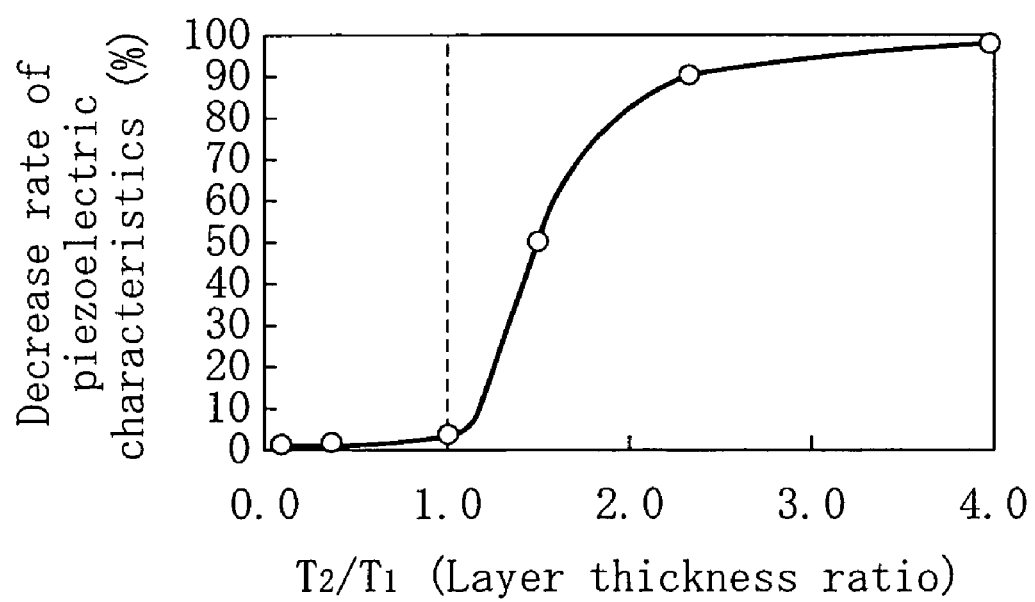
FIG. 6 is a graph showing the relationship between the layer thickness ratio T2/T1 and the decrease rate of the piezoelectric characteristics according to an embodiment.

As a result of this measurement, it was found that the decrease rate of the piezoelectric characteristics is generally 0% when the relationship of 0<T2/T1≦1 is satisfied as shown in FIG. 6.

For another measurement, a plurality of piezoelectric actuators 21 having different thickness ratios (T2/T1) were prepared. A constant voltage was applied for a certain time period between the common electrode 27 and the individual electrode 33 in each of the piezoelectric actuators 21 having different thickness ratios (T2/T1), and the number of portions in which dielectric breakdown was caused by application of the voltage was counted. Then, the incidence of dielectric breakdown of the piezoelectric actuators 21 was calculated based on the number of portions in which dielectric breakdown was caused. Herein, the incidence of dielectric breakdown means the ratio of the area of the portions in which dielectric breakdown was caused to the area of the individual electrode 33 in each of the piezoelectric actuators 21 having different thickness ratios (T2/T1).

Figures 7, 8:
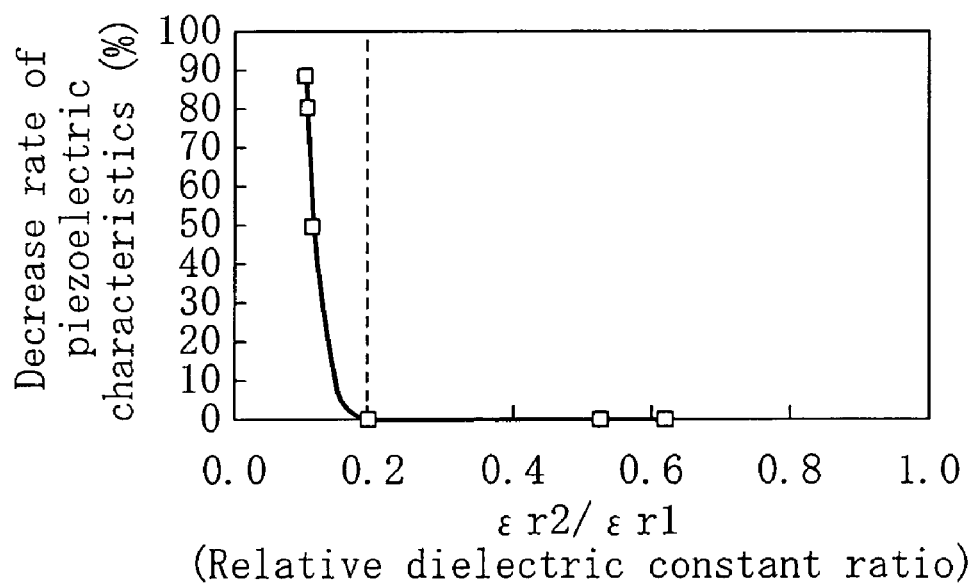
FIG. 7 is a table showing the relationship between the layer thickness ratio T2/T1 and the incidence of dielectric breakdown according to an embodiment.
FIG. 8 is a graph showing the relationship between the relative dielectric constant ratio ∈r2/∈r1 and the decrease rate of the piezoelectric characteristics according to an embodiment.

As a result of this measurement, it was found that the incidence of dielectric breakdown is 0% so long as at least the relationship of T2/T1≧0.08 is satisfied as shown in FIG. 7.

For still another measurement, a plurality of piezoelectric actuators 21 having different relative dielectric constant ratios (∈r2/∈r1) of the relative dielectric constant of the piezoelectric layer 29 (∈r1) and the relative dielectric constant of the cover layer 31 (∈r2) were prepared. The displacement caused when a voltage was applied between the common electrode 27 and the individual electrode 33 in each of the piezoelectric actuators 21 having different relative dielectric constant ratios (∈r2/∈r1) was measured. The decrease rate of the piezoelectric characteristics of each piezoelectric actuator 21 was estimated based on the displacement.

As a result of this measurement, it was found that the decrease rate of the piezoelectric characteristics is generally 0% when the relationship of ∈r2/∈r1≧0.2 is satisfied as shown in FIG. 8.

In the case where the piezoelectric layer 29 is formed of Pb(Zr,Ti)O$_3$ and the cover layer 31 is formed of a material including Ti, such as BaTiO$_3$, or the like, the adhesion between the piezoelectric layer 29 and the cover layer 31 is improved because the piezoelectric layer 29 and the cover layer 31 include a common chemical element, Ti. As a result, separation of the piezoelectric layer 29 and the cover layer 31 and generation of a crack are prevented.

In the case where both the piezoelectric layer 29 and the cover layer 31 are formed of Pb(Zr,Ti)O$_3$, the adhesion between the piezoelectric layer 29 and the cover layer 31 is improved because the piezoelectric layer 29 and the cover layer 31 have the same composition. As a result, separation of the piezoelectric layer 29 and the cover layer 31 and generation of a crack are prevented. In order to surely prevent the gaps 55 from expanding in the cover layer 31, it is necessary to prevent the cover layer 31 from epitaxially growing with respect to the piezoelectric layer 29. Thus, it is preferable that the piezoelectric layer 29 and the cover layer 31 have different crystallinities.

In the case where the cover layer 31 is formed of a piezoelectric material, such as BaTiO$_3$, Pb(Zr,Ti)O$_3$, or the like, the deterioration of the piezoelectric characteristics which may be caused by provision of the cover layer 31 is suppressed.

Although in the present embodiment the cover layer 31 is formed of a piezoelectric material, it may be formed of another insulating material, such as a high dielectric material (ferroelectric material). The high dielectric material used in the cover layer 31 may be any type of high dielectric material, such as a high dielectric material having low piezoelectric characteristics, a high dielectric material having no piezoelectric characteristic, or the like. Examples of the high dielectric material used in the cover layer 31 include titanium oxide (rutile oxide) (TiO$_2$) having a relative dielectric constant of about 100, silicon carbide (SiC) having a relative dielectric constant of about 85, etc.

Although in the present embodiment the piezoelectric layer 29 is formed of Pb(Zr,Ti)O$_3$, it may be formed of another piezoelectric material.

The defective portions 51, 53 and 55 are filled with part of the cover layer 31, and therefore, the adhesion between the piezoelectric layer 29 and the cover layer 31 is improved. As a result, separation of the piezoelectric layer 29 and the cover layer 31 and generation of a crack are further prevented. Herein, it is preferable that the defective portions 51, 53 and 55 are filled with part of the cover layer 31. However, the defective portions 51, 53 and 55 do not need to be filled with the cover layer 31 so long as the defective portions 51, 53 and 55 are sealed by the cover layer 31.

The thickness of the piezoelectric layer 29 in the lamination direction (T1), the thickness of the cover layer 31 in the lamination direction (T2), the relative dielectric constant of the piezoelectric layer 29 (∈r1), and the relative dielectric constant of the cover layer 31 (∈r2) may have any values so long as at least one of the relationships of T2/T1≧0.08, 0<T2/T1≦1, and ∈r2/∈r1≧0.2 is satisfied. More preferably, the thickness of the piezoelectric layer 29 in the lamination direction (T1), the thickness of the cover layer 31 in the lamination direction (T2), the relative dielectric constant of the piezoelectric layer 29 (∈r1), and the relative dielectric constant of the cover layer 31 ($\epsilon r2$) satisfy both the relationship of $0.08 \leq T2/T1 \leq 1$ and the relationship of $\epsilon r2/\epsilon r1 \geq 0.2$.

In the present embodiment, the thickness of the piezoelectric layer 29 in the lamination direction (T1), and the like, are determined based on the above-described experimental results. However, the thickness of the piezoelectric layer 29 in the lamination direction (T1), the thickness of the cover layer 31 in the lamination direction (T2), the relative dielectric constant of the piezoelectric layer 29 ($\epsilon r1$), and the relative dielectric constant of the cover layer 31 ($\epsilon r2$) may have any values so long as the piezoelectric actuator 21 is constructed by forming the common electrode 27, the piezoelectric layer 29, the cover layer 31 and the individual electrode 33 in this order into a layered structure (see FIG. 3) or the piezoelectric actuator 21 is constructed by forming the individual electrode 33, the piezoelectric layer 29, the cover layer 31 and the common electrode 27 in this order into a layered structure (see FIG. 4). With such arrangements, the voltage-withstanding characteristics of the piezoelectric layer 29 are improved, and the dielectric breakdown is prevented.

In the present embodiment, the common electrode 27 functions as a diaphragm. However, a separate diaphragm may be provided. In this case, in a piezoelectric actuator 21 formed by actuator formation method 1, the diaphragm is formed on the Si substrate 47, the individual electrode 33, or the like. In a piezoelectric actuator 21 formed by actuator formation method 2, the diaphragm is formed on the MgO substrate 47, the common electrode 27, or the like.

In the piezoelectric actuator 21 formed by actuator formation method 1, the common electrode 27 is formed on the Si substrate 47. However, the individual electrode 33 may be formed on the Si substrate 47. In this case, the common electrode 27 is formed on the cover layer 31.

In the piezoelectric actuator 21 formed by actuator formation method 2, the individual electrode 33 (the electrode 49) is formed on the MgO substrate 47. However, the common electrode 27 may be formed on the MgO substrate 47. In this case, the individual electrode 33 is formed on the cover layer 31.

The common electrode 27, the individual electrode 33, and the like, may be formed of a material different from those described above in the present embodiment, and may have a thickness different from those described above in the present embodiment.

INDUSTRIAL APPLICABILITY

As described above, the present invention is useful when it is applied to a printer of a computer, a facsimile machine, a copying machine, or the like.

The invention claimed is:

1. A piezoelectric actuator, comprising:
   a first electrode layer;
   a piezoelectric layer formed of a piezoelectric material on the first electrode layer;
   a cover layer formed of an insulating material on the piezoelectric layer and
   a second electrode layer formed on the cover layer, which functions together with the first electrode layer to apply a voltage to the piezoelectric layer,
   wherein the thickness of the piezoelectric layer in the lamination direction, T1, and the thickness of the cover layer in the lamination direction, T2, satisfy the relationship of $0 < T2/T1 \leq 1$; and
   the piezoelectric layer and the cover layer have different crystal orientations from one another so that the cover layer does not epitaxially grow with respect to the piezoelectric layer, in order to prevent a defective portion in the piezoelectric layer from expanding in the cover layer.

2. A piezoelectric actuator, comprising:
   a first electrode layer;
   a piezoelectric layer formed of a piezoelectric material on the first electrode layer;
   a cover layer formed of an insulating material on the piezoelectric layer and
   a second electrode layer formed on the cover layer, which functions together with the first electrode layer to apply a voltage to the piezoelectric layer,
   wherein the thickness of the piezoelectric layer in the lamination direction, T1, and the thickness of the cover layer in the lamination direction, T2, satisfy the relationship of $T2/T1 \geq 0.08$; and
   the piezoelectric layer and the cover layer have different crystal orientations from one another so that the cover layer does not epitaxially grow with respect to the piezoelectric layer, in order to prevent a defective portion in the piezoelectric layer from expanding in the cover layer.

3. A piezoelectric actuator, comprising:
   a first electrode layer;
   a piezoelectric layer formed of a piezoelectric material on the first electrode layer;
   a cover layer formed of an insulating material on the piezoelectric layer and
   a second electrode layer formed on the cover layer, which functions together with the first electrode layer to apply a voltage to the piezoelectric layer.
   wherein the relative dielectric constant of the piezoelectric layer, $\epsilon r1$, and the relative dielectric constant of the cover layer, $\epsilon r2$, satisfy the relationship of $\epsilon r2/\epsilon r1 \geq 0.2$; and
   the piezoelectric layer and the cover layer have different crystal orientations from one another so that the cover layer does not epitaxially grow with respect to the piezoelectric layer, in order to prevent a defective portion in the piezoelectric layer from expanding in the cover layer.

4. The piezoelectric actuator of claim 1, wherein the thickness of the piezoelectric layer in the lamination direction, T1, and the thickness of the cover layer in the lamination direction, T2, satisfy the relationship of $T2/T1 0.08$.

5. The piezoelectric actuator of claim 1 wherein the relative dielectric constant of the piezoelectric layer, $\epsilon r1$, and the relative dielectric constant of the cover layer, $\epsilon r2$, satisfy the relationship of $\epsilon r2/\epsilon r1 \geq 0.2$.

6. The piezoelectric actuator of claim 2, wherein the relative dielectric constant of the piezoelectric layer, $\epsilon r1$, and the relative dielectric constant of the cover layer, $\epsilon r2$, satisfy the relationship of $\epsilon r2/\epsilon r1 \geq 0.2$.

7. The piezoelectric actuator of claim 2, wherein:
   the thickness of the piezoelectric layer in the lamination direction, T1, and the thickness of the cover layer in the lamination direction, T2, satisfy the relationship of $T2/T1 \geq 1$; and
   the relative dielectric constant of the piezoelectric layer, $\epsilon r1$, and the relative dielectric constant of the cover layer, $\epsilon r2$, satisfy the relationship of $\epsilon r2/\epsilon r1 \geq 0.2$.

8. The piezoelectric actuator of claim 1, wherein the piezoelectric layer and the cover layer include at least one same chemical element.

9. The piezoelectric actuator of claim 2, wherein the piezoelectric layer and the cover layer include at least one same chemical element.

10. The piezoelectric actuator of claim 3, wherein the piezoelectric layer and the cover layer include at least one same chemical element.

11. The piezoelectric actuator of claim 1, wherein the cover layer is formed of a piezoelectric material.

12. The piezoelectric actuator of claim 2, wherein the cover layer is formed of a piezoelectric material.

13. The piezoelectric actuator of claim 3, wherein the cover layer is formed of a piezoelectric material.

14. The piezoelectric actuator of claim 1, wherein part of the cover layer fills a defective portion formed in the piezoelectric layer or a defective portion continuously formed in the first electrode layer and the piezoelectric layer.

15. The piezoelectric actuator of claim 2, wherein part of the cover layer fills a defective portion formed in the piezoelectric layer or a defective portion continuously formed in the first electrode layer and the piezoelectric layer.

16. The piezoelectric actuator of claim 3, wherein part of the cover layer fills a defective portion formed in the piezoelectric layer or a defective portion continuously formed in the first electrode layer and the piezoelectric layer.

17. An inkjet head comprising the piezoelectric actuator of claim 1.

18. An inkjet head comprising the piezoelectric actuator of claim 2.

19. An inkjet head comprising the piezoelectric actuator of claim 3.

20. An inkjet recording apparatus, comprising:
   the inkjet head of claim 17; and
   transfer means for relatively transferring the inkjet head and a recording medium.

21. An inkjet recording apparatus, comprising:
   the inkjet head of claim 18; and
   transfer means for relatively transferring the inkjet head and a recording medium.

22. An inkjet recording apparatus, comprising:
   the inkjet head of claim 19; and
   transfer means for relatively transferring the inkjet head and a recording medium.

* * * * *

UNITED STATES PATENT AND TRADEMARK OFFICE
CERTIFICATE OF CORRECTION

PATENT NO.         : 7,264,340 B2                                     Page 1 of 1
APPLICATION NO.    : 10/497348
DATED              : September 4, 2007
INVENTOR(S)        : Takanori Nakano et al.

It is certified that error appears in the above-identified patent and that said Letters Patent is hereby corrected as shown below:

Column 12

Line 34, Claim 3, "... to the piezoelectric layer." should be -- to the piezoelectric layer, --
Line 48, Claim 4, "... T2/T10.08." should be -- ... T2/T1≥0.08. --

Signed and Sealed this

Twenty-seventh Day of November, 2007

JON W. DUDAS
*Director of the United States Patent and Trademark Office*